(12) United States Patent
Ayazi et al.

(10) Patent No.: US 7,933,112 B2
(45) Date of Patent: Apr. 26, 2011

(54) MICRO-ELECTROMECHANICAL VOLTAGE TUNABLE CAPACITOR AND AND FILTER DEVICES

(75) Inventors: Farrokh Ayazi, Atlanta, GA (US); Mina Raieszadeh, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 512 days.

(21) Appl. No.: 11/999,114

(22) Filed: Dec. 4, 2007

(65) Prior Publication Data
US 2009/0002915 A1 Jan. 1, 2009

Related U.S. Application Data

(60) Provisional application No. 60/868,822, filed on Dec. 6, 2006.

(51) Int. Cl.
*H01L 21/00* (2006.01)
(52) U.S. Cl. .................. 361/287; 257/415; 334/14
(58) Field of Classification Search .................. 361/287; 334/14; 257/415
See application file for complete search history.

(56) References Cited

U.S. PATENT DOCUMENTS

| | | | | |
|---|---|---|---|---|
| 5,959,515 A * | 9/1999 | Cornett et al. | | 334/14 |
| 5,959,516 A * | 9/1999 | Chang et al. | | 334/14 |
| 6,074,890 A * | 6/2000 | Yao et al. | | 438/52 |
| 6,094,102 A * | 7/2000 | Chang et al. | | 331/17 |
| 6,232,847 B1 * | 5/2001 | Marcy et al. | | 331/167 |
| 6,377,438 B1 * | 4/2002 | Deane et al. | | 361/278 |
| 6,909,221 B2 * | 6/2005 | Ayazi et al. | | 310/321 |
| 7,023,065 B2 * | 4/2006 | Ayazi et al. | | 257/414 |
| 7,176,770 B2 * | 2/2007 | Ayazi et al. | | 333/186 |
| 7,511,870 B2 * | 3/2009 | Ho et al. | | 359/237 |
| 7,564,162 B2 * | 7/2009 | Ho et al. | | 310/309 |
| 7,639,105 B2 * | 12/2009 | Ayazi et al. | | 333/186 |
| 7,812,692 B2 * | 10/2010 | Ayazi et al. | | 333/187 |
| 7,843,284 B2 * | 11/2010 | Ayazi et al. | | 333/186 |
| 7,847,669 B2 * | 12/2010 | Ayazi et al. | | 336/200 |
| 2004/0021403 A1 * | 2/2004 | Ayazi et al. | | 310/365 |
| 2005/0124135 A1 * | 6/2005 | Ayazi et al. | | 438/424 |
| 2006/0001124 A1 * | 1/2006 | Ayazi et al. | | 257/531 |
| 2006/0044078 A1 * | 3/2006 | Ayazi et al. | | 333/186 |
| 2006/0125576 A1 * | 6/2006 | Ho et al. | | 333/186 |
| 2007/0001267 A1 * | 1/2007 | Ayazi et al. | | 257/622 |
| 2008/0136572 A1 * | 6/2008 | Ayazi et al. | | 336/90 |
| 2008/0143217 A1 * | 6/2008 | Ho et al. | | 310/367 |
| 2008/0297281 A1 * | 12/2008 | Ayazi et al. | | 333/192 |
| 2009/0002915 A1 * | 1/2009 | Ayazi et al. | | 361/287 |
| 2010/0044808 A1 * | 2/2010 | Dekker et al. | | 257/415 |
| 2010/0066467 A1 * | 3/2010 | Ayazi et al. | | 333/187 |
| 2010/0176489 A1 * | 7/2010 | Ayazi et al. | | 257/595 |

OTHER PUBLICATIONS

S. Park, K. Y. Lee, and G. M. Rebeiz, "Low-loss 5.15-5.70-GHz RF MEMS switchable filter for wireless LAN applications,"IEEE Transaction of Microwave Theory and Technique, vol. 54, No. 11, pp. 3931-3939, Nov. 2006.

(Continued)

*Primary Examiner* — Laura M Menz
(74) *Attorney, Agent, or Firm* — Thomas, Kayden, Horstemeyer & Risley, LLP (57) ABSTRACT

Disclosed are one-port and two-port voltage-tunable microelectromechanical capacitors, switches, and filter devices. High aspect-ratio metal micromachining is used to implement very high quality factor (Q) tunable and fixed capacitors, fixed inductors, and low insertion loss tunable and fixed bandpass LC filters. The tunable capacitors can move in the plane of the substrate by the application of DC voltages and achieve greater than 100% of tuning. A combination of lowloss substrate and highest conductivity metal is used to achieve record high Q and low insertion loss at radio frequencies. The disclosed tunable capacitor structure can also be used as a micromechanical switch.

17 Claims, 9 Drawing Sheets

OTHER PUBLICATIONS

K. Fedder and T. Mukherjee, "Turnable RF and analog circuits using on-chip MEMS passive components,"IEEE International Solid State Circuits Conference (ISSCC '05), San Francisco, CA, pp. 390-391, Feb. 2005.

P. Monajemi, et al.,"A low-cost wafer-level packaging technology," IEEE International Conference on Microelectromechanical Systems, Miami, FL, Jan. 2005, pp. 634-637.

James Salvia et al, "Tunable on-Chip Inductors up to 5 GHz using patterned permalloy Laminations,"Dec. 2005 IEEE IEDM, pp. 943-946.

Shih et al, "Tunable solenoid microinductors utilizing Permalloy electro-thermal vibromotors," Sep. 2004 IEEE MEMS, pp. 793-796.

C. M. Tassetti et al., "Tunable RF MEMS microinductors for future communication systems," Sep. 2003 IEEE MTT-S, vol. 3, pp. 541-545.

I. Zine-El-Abidine et al., "RF MEMS tunable inductor," 2004 IEEE Microwaves, Radar and Wireless Corn., vol. 3, pp. 817-819, May 2004.

P. Monajemi et al, "A Low-cost Wafer-level Packaging Technology," 2005 IEEE MEMS, Jan. 2005, pp. 634-637.

M. Rais-Zadeh et al, "High-Q Micromachined Silver Passives and Filters," accepted to IEEE IEDM, Dec. 2006.

M. Rais-Zadeh et al., "Characterization of high-Q sprial inductors on thick insulator-on-silicon" J. of Micromechanics and Microengineering (Sep. 2005) vol. 15 pp. 2105-2112.

M. Raieszadeh et al., "High-Q integrated inductors on trenched Si islands" Proc. of IEEE MEMS Conf. (Jan. 2005) pp. 199-202.

R. Manepalli et al., "Silver metallization for advanced interconnects" IEEE Trans. Advanced Packaging (Feb. 1999) vol. 22 No. 1 pp. 4-8.

* cited by examiner

MICRO-ELECTROMECHANICAL VOLTAGE TUNABLE CAPACITOR AND AND FILTER DEVICES

CROSS REFERENCE TO RELATED APPLICATIONS

This application claims priority to copendinq U.S. provisional application entitled "HERMETICALLY SEALED SILVER MICRO-STRUCTURES FOR RF FILTERS AND PASSIVES" having Ser. No. 60/868,822, filed Dec. 6, 2006.

STATEMENT REGARDING FEDERALLY SPONSORED RESEARCH OR DEVELOPMENT

This invention was made with government support under agreement ECS-0348286 awarded by the National Science Foundation. The Government has certain rights in the invention.

BACKGROUND

The present invention relates to microelectromechanical systems (MEMS) tunable capacitors, switches and filter devices.

MEMS-based RF components are leading candidates for cellular front-end modules that need to support an increasing number of frequency bands and communication standards. Currently, most of the high-Q bandpass filters used in cellular modules are realized using off-chip, acoustic-resonant components, such as SAW devices. While SAW filters offer very low insertion loss (IL) and high quality factor (Q), they cannot be tuned, and therefore many transmit and receive SAW filters are needed to cover multiple frequency bands. Also, off-chip components must interface with integrated electronics at the board level, which introduces additional loss and creates a bottleneck to miniaturization of these modules.

Integrated single chip solutions to cellular modules are therefore desirable. Tunable MEMS LC filters can be prime candidates for multi-band cellular application if they meet the desired band specification in terms of insertion loss, out of band rejection, and Q. To increase the Q of an LC filter while maintaining low insertion loss, high Q tunable one-port and two-port (isolated) capacitors and inductors are needed. To date, lumped-element filters have failed to show tunable integrated solutions with low insertion loss in the UHF range (300 MHz-3 GHz) due to the fact that the loaded quality factors (Q) of on-chip inductors and capacitors (fixed and/or tunable) have not been adequately high. The required component Q to achieve small-bandwidth UHF filters with low insertion loss is greater than 100.

Although distributed filters have been shown at frequencies >5 GHz [S. Park, K. Y. Lee, and G. M. Rebeiz, "Low-loss 5.15-5.70-GHz RF MEMS switchable filter for wireless LAN applications," *IEEE Transaction of Microwave Theory and Technique*, vol. 54, no. 11, pp. 3931-3939, November 2006], the size of such filters in the UHF range would be much larger (>10x) than the alternative lumped element filters. Also, the majority of reported tunable filters use an array of switched capacitors or other discrete tuning methods [see, G. K. Fedder and T. Mukherjee, "Tunable RF and analog circuits using on-chip MEMS passive components," *IEEE International Solid-State Circuits Conference (ISSCC '05)*, San Francisco, Calif., pp. 390-391, February 2005] to achieve frequency tuning. Continuous tuning, on the other hand, offers the additional benefit of adjusting the frequency response to account for any fabrication inaccuracies.

Thus, there is a need for improved tunable passives and filter devices for use in RF integrated circuits. To overcome the shortcoming of the prior art passives and LC filters, an improved design and micro-fabrication method for tunable and fixed inductors and tunable capacitors is necessary.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Disclosed is the use of high aspect-ratio metal micromachining for implementing very high quality factor (Q) tunable and fixed passive devices 10, such as capacitors 10, and low insertion loss bandpass fixed and tunable LC filters 10. Aspect ratio is defined as the ratio of the out-of-plane thickness of the device to the smallest lateral gap size. As disclosed herein, high aspect-ratio silver (Ag) micromachining is used to create lateral tunable capacitors 10, high-Q two-port tunable capacitors 10, record high-Q inductors 10, and bandpass filters 10. Losses resulting from the use of silicon (Si) as a substrate are eliminated by using micromachining techniques. Using the disclosed CMOS-compatible fabrication methods 30, a third order fixed-frequency elliptic LC filter 10 was fabricated, which exhibits an insertion loss of 0.9 dB at 1.2 GHz. A tunable filter 10 was fabricated using the disclosed fabrication method 30 that exhibited an insertion loss of 4.0 dB at 830 MHz with a bandwidth of 70 MHz. Wafer-level polymer packaging of the filter 10 did not cause any additional loss.

Fabrication

Figure 1A:
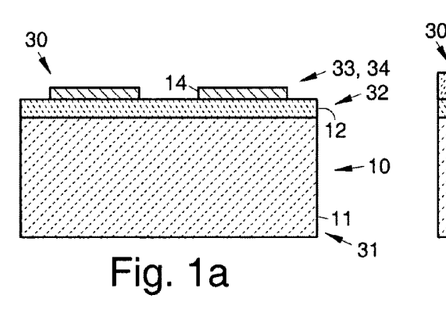
FIGS. 1a-h illustrate exemplary surface micromachining fabrication methods for producing high aspect-ratio tunable and fixed silver passives.
Figure 1B:
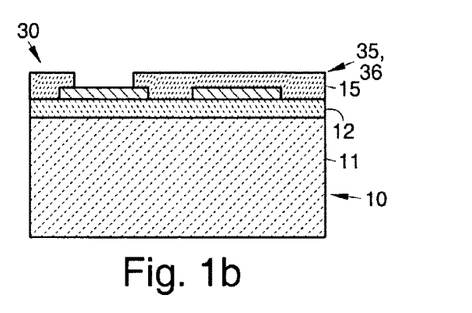
Figure 1C:
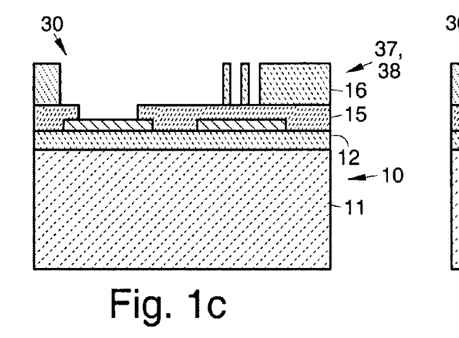
Figure 1D:
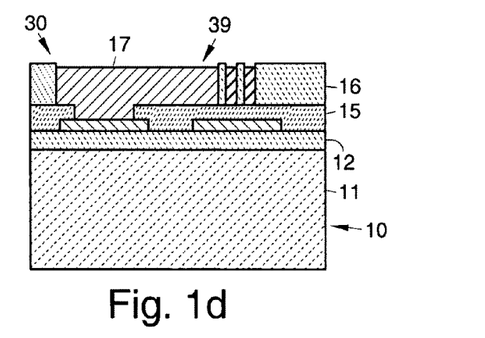
Figure 1E:
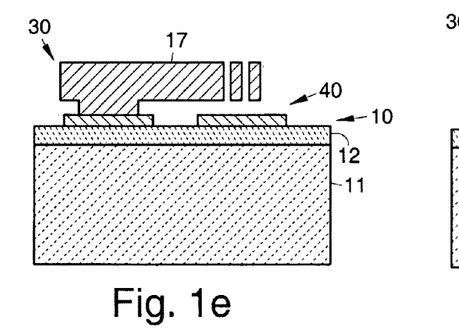

Exemplary methods 30 for fabricating and encapsulating (packaging) tunable and fixed silver passives 10, inductors 10 and filters 10 are shown in FIGS. 1a-h. As is shown in FIG. 1a, a silicon substrate 11 is provided 31. The substrate 11 is passivated 32 with a thick dielectric layer 12. Avatrel™ polymer 12 from Promerus may be used for this purpose because of its low permittivity and loss tangent. Next, a routing metal layer 14 is deposited (evaporated) 33 and patterned 34 (2 µm titanium/silver, for example). As is shown in FIG. 1b, a dielectric layer 15 is then applied 35 and patterned 36. As is shown in FIG. 1c, a thick electroplating mold 16 is then applied 37 and patterned 38. As is shown in FIG. 1d, a thick (40 µm, for example) silver layer 17 is then electroplated 39 into NR4-8000P negative-tone photoresist from Futurrex, for example, used as an electroplating mold 16. As is shown in FIG. 1e, devices are released 40 from the substrate 11 and dielectric layer 12. Devices may be released 40 using either wet release (FIG. 1e) or dry release (FIG. 1e'). Inductors 10 as well as fixed and tunable capacitors 10 may be simultaneously fabricated using the exemplary methods 30.

Figure 1F:
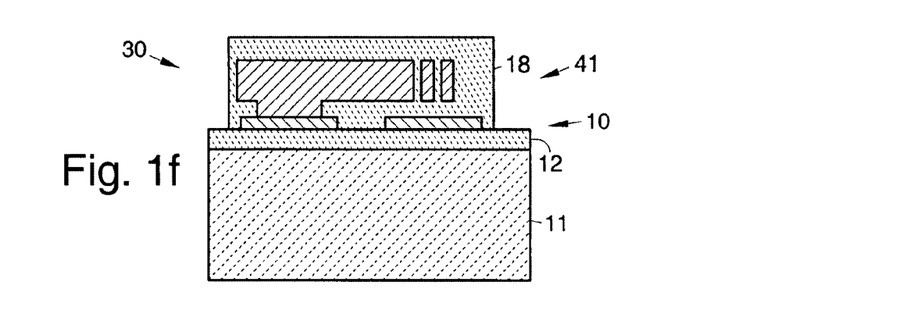
Figure 1G:
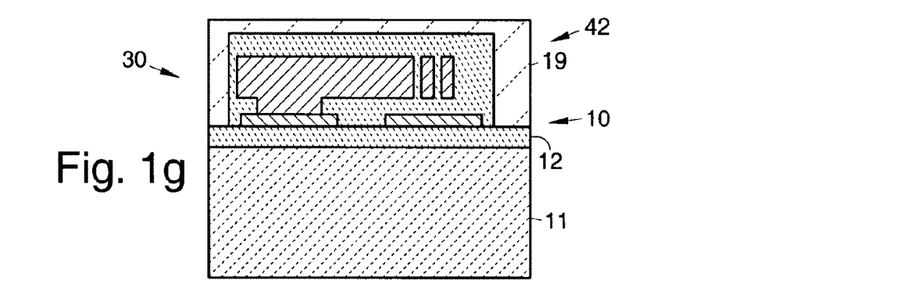
Figure 1H:
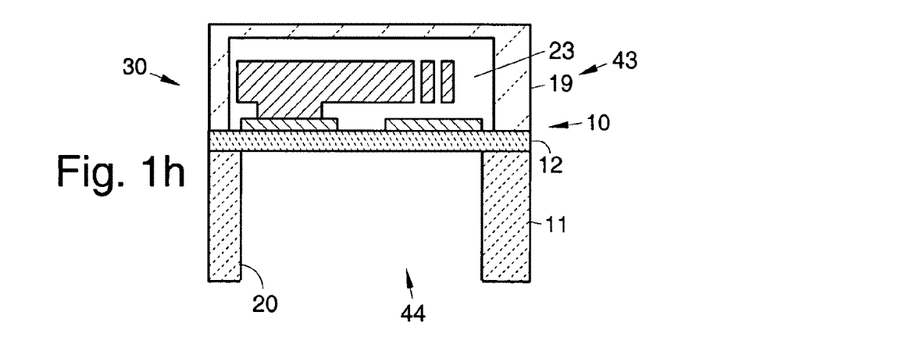

The released devices 10 are then wafer-level packaged 41-43 as shown in FIGS. 1f-1h. This may be done as disclosed by P. Monajemi, et al., in "A low-cost wafer-level packaging technology," *IEEE International Conference on Microelectromechanical Systems*, Miami, Fla., January 2005, pp. 634-637, for example. A thermally-decomposable sacrificial polymer 18, such as Unity® (available from Promerus LLC, Brecksville, Ohio, 44141), is applied and patterned 41 (FIG. 1f). Then, an over-coat polymer 19 (Avatrel™, for example), which is thermally stable at the decomposition temperature of the decomposable sacrificial polymer 18, is spin-coated and patterned 42 (FIG. 1g). The sacrificial polymer 18 may be decomposed 43 at 180° C., for example (FIG. 1h). As discussed in the P. Monajemi, et al. paper, the resulting gaseous products diffuse out through a solid Avatrel™ over-coat polymer 19 with no perforations.

As is shown in FIG. 1h, the loss normally caused by the silicon substrate 11 may be eliminated, if necessary, by selectively backside etching 44 the silicon 11 underneath the passive devices 10 to form an optional backside cavity 20, leaving behind a thin diaphragm of passivation dielectric 12 (polymer membrane). Furthermore, as is shown in FIGS. 1e and 1e', the tunable capacitor device 10 may be configured as either one-port devices 10 or two-port devices 10.

Figure 2A:
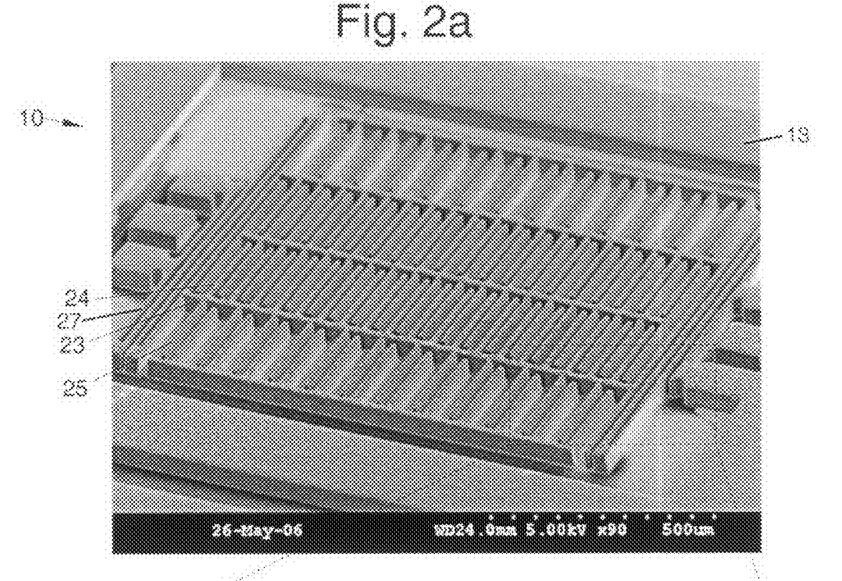
FIGS. 2a and 2a' are scanning electron microscope (SEM) views of a thick high aspect-ratio one-port lateral tunable interdigitated silver capacitor fabricated using the method illustrated in FIGS. 1a-e.
Figure 2B:
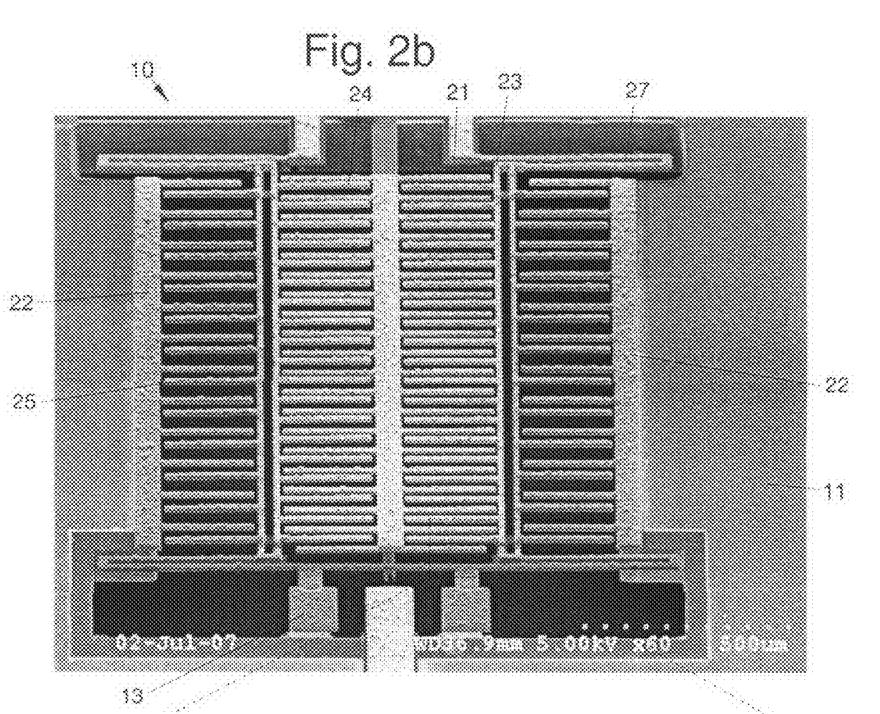
FIGS. 2b and 2b' are SEM views of a thick high aspect-ratio two-port lateral tunable interdigitated silver capacitor fabricated using the method illustrated in FIGS. 1a-e.

An exemplary one-port device 10 is illustrated in FIGS. 2a and 2a'. An exemplary two-port device 10 is illustrated in FIGS. 2b and 2b'. FIG. 2a shows a one-port device 10 wherein a movable port of a tunable capacitor 24 and a movable port of an actuator 25 are electrically coupled by way of a solid conductive shuttle 23 that is connected to ground 13. FIG. 2b shows a two-port device 10 wherein the tunable capacitor 24 is electrically decoupled (isolated) from the actuator 25 and the ground 13 using a dielectric 15 that mechanically connects the isolated movable port of the capacitor 24 to the grounded movable port of the actuator 25.

The silver passive devices 10 have a very small series resistance due to the high conductivity of electroplated silver, and thus can exhibit very high Q. Therefore, special care must be taken in measuring the Q. On-wafer S-parameter measurements of fabricated devices 10 have been carried out using a hp8510C vector network analyzer and Cascade GSG infinity (I-50) microprobes. Accurate measurement of Q in excess of 80 calls for a very thorough calibration. Calibration was done using both SOLT and LRRM calibration procedures and the pad parasitics were not de-embedded to avoid over estimation of Q. Also, to ensure repeatability in the measurements, the high-Q passive devices 10 were measured several times, and each time the calibration was redone. The deviation of the measurement values is within 10% for Q in excess of 100.

Microelectromechanical Lateral Tunable Capacitors

The above-described methods 30 may be used to fabricate voltage tunable micromechanical capacitor devices 10, for example. FIGS. 2a and 2a' show SEM views of an exemplary high aspect-ratio 40 µm thick silver tunable lateral one-port interdigitated capacitor device 10 comprising a number of individual fingers. The number of the interdigitated fingers defines the capacitance value, given a specific thickness and capacitive gap for the device. FIG. 2a' is an enlarged view of the lower right portion of FIG. 2a. A dual gap actuation scheme, where the capacitive gap 29 is smaller than the actuation gap 29a, was chosen to obtain the highest tuning range.

An exemplary voltage tunable micromechanical one-port capacitor device 10 comprises a substrate 11 having a dielectric layer 12 disposed thereon. A routing layer 14 maybe optionally disposed on the dielectric layer 12. A fixed interdigitated conductive capacitor plate 21 is disposed on routing layer 14. A fixed interdigitated conductive actuator plate 22 is disposed on the routing layer 14. A laterally movable conductive shuttle 23 is disposed between the fixed interdigitated capacitor plate 21 and the fixed interdigitated actuator plate 22. The laterally movable shuttle 23 holds the movable interdigitated plates of the tunable capacitor 24 and the movable interdigitated plates of the actuator 25. The interdigitated movable plates of the capacitor and actuator 24, 25 and the shuttle 23 are separated from the substrate 11 by a gap 26. The tuning voltage of the actuator 25 is determined by the stiffness of spring 27 coupled to the movable shuttle 23.

FIGS. 2b and 2b' show SEM views of a two-port (isolated) high aspect-ratio 20 µm thick silver tunable lateral capacitor 10. Silicon dioxide may be used to isolate the capacitor from the movable actuator 25 while providing a mechanical connection between them. The shuttle 23 is separated into two parts that are electrically isolated by a gap 28.

More particularly, as is shown in FIGS. 2b and 2b' the capacitor 10 comprises a substrate 11 having a dielectric layer 12 disposed thereon. A fixed interdigitated conductive capacitor plate 21 is disposed on the dielectric layer 12. A fixed interdigitated conductive actuator plate 22 is disposed on the dielectric layer 12. A laterally movable conductive shuttle 23 is provided that comprises a laterally movable interdigitated conductive capacitor plate 24 disposed between the fixed capacitor plate 21 and the movable actuator plate 25, a laterally movable interdigitated conductive actuator plate 25 disposed between the movable capacitor plate 24 and the fixed actuator plate 22, and a movable dielectric layer 15 disposed between the movable capacitor plate 24 and the movable actuator plate 25, providing mechanical connection between them.

Regarding materials that may be employed to fabricate the capacitors 10, the substrate 11 may be silicon, CMOS, BiCMOS, gallium arsenide, indium phosphide, glass, ceramic, silicon carbide, sapphire, organic or polymer. The conductive layers 21, 22, 23, 24, and 25 may be silver, gold, aluminum, nickel or copper. The dielectric layers 12, 15 may be air, silicon dioxide, silicon nitride, hafnium dioxide, zirconium oxide or low-loss polymer. The routing metal layer 14 may include polysilicon, silver, gold, aluminum, nickel, and copper.

The interdigitated fingers of the capacitor can be coated 45 with a low-loss dielectric 46 (Parylene, for example) after the device 10 is released to increase the capacitance value, as shown in FIG. 1*e″*. Parylene polymer can be used for this purpose as it conformally coats the released device and can be deposited at low temperature.

Figure 3:
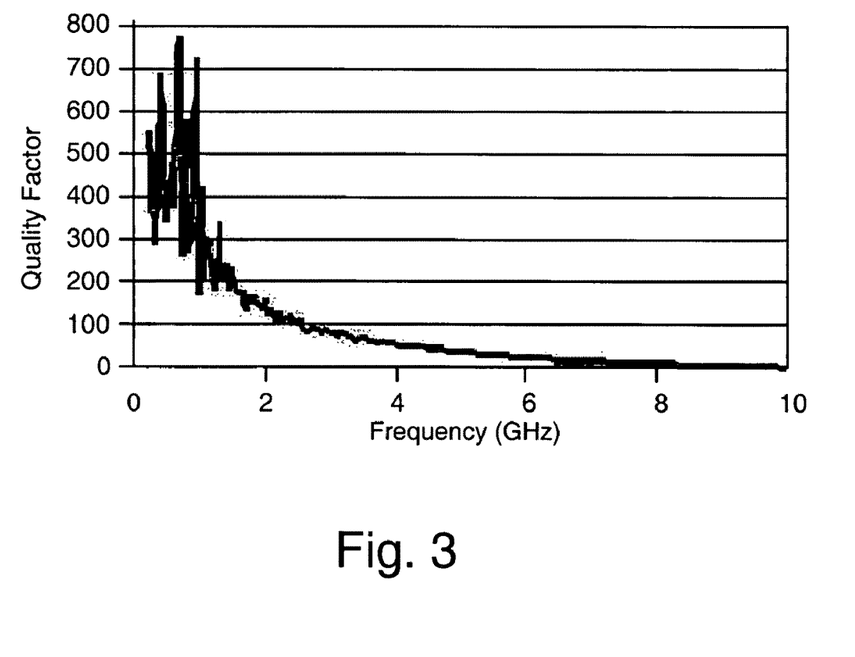
FIG. 3 illustrates measured Q of a 0.4 pF lateral tunable interdigitated silver capacitor fabricated on an Avatrel™ diaphragm illustrated in FIGS. 2a and 2a'.
Figure 4:
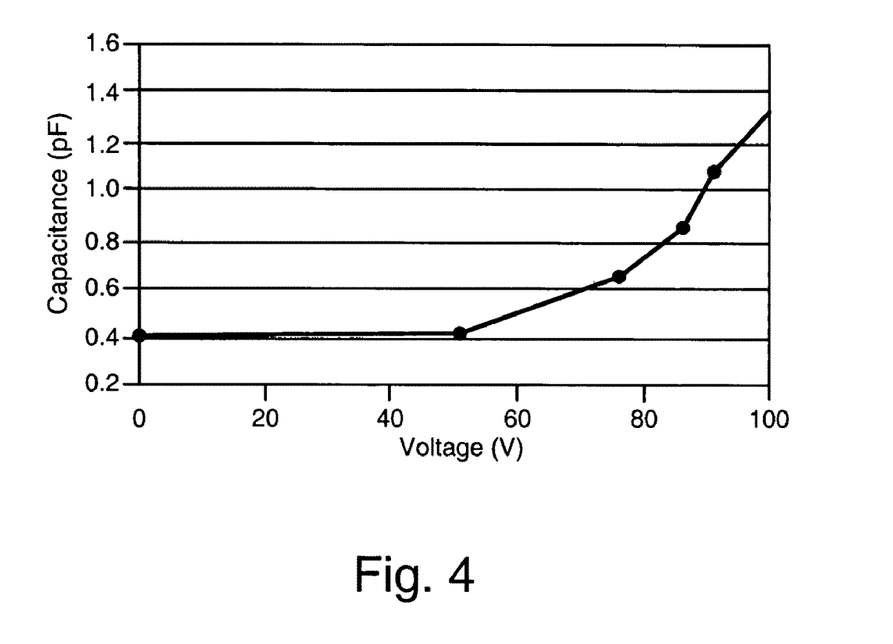
FIG. 4 shows a C-V tuning curve of the tunable silver capacitor illustrated in FIGS. 2a and 2a'.

FIG. 3 shows the extracted Q of the capacitor 10 shown in FIGS. 2*a* and 2*a'*, showing Q>100 up to 3 GHz and a self resonance frequency (SRF) above 6 GHz. The Q and the capacitance (C) are extracted from the measured S-parameter using the formulas:

$$Q = \frac{\text{Im}(Y_{11})}{\text{Re}(Y_{11})}, \text{ and } C = \frac{\text{Im}(Y_{11})}{\omega(1 - \text{Re}(Y_{11}))} \quad (1)$$

where, $\omega$ is the angular frequency. The size of the actuation gap 29*a* of this capacitor is about three times the size of the sense gap 29, and therefore the tuning range of this capacitor 10 is ideally infinite with the application of 150V. The capacitor 10 exhibits a tuning of 3.3:1 with the application of 100V. A C-V tuning curve for this capacitor 10 is shown in FIG. 4.

Tuning voltages of these capacitors 10 are high due to the conservative design of the size of the actuation gap 29*a*, and can be reduced by decreasing the size of the actuation gap 29*a* and the width of the spring 27. Also, the high frequency Q of these capacitors 10 is low because of the series parasitic inductance of the folded springs 27, which significantly lowers the SRF. Use of non-folded springs 27 considerably improves the high frequency behavior of these tunable capacitors 10.

Micromechanical Lateral Switches

The above-described methods 30 may be also used to fabricate micromechanical switch devices 10, for example. The switch structure can be the same as that of the one-port and two-port tunable capacitor. Therefore, the switch comprises: a substrate 11, a dielectric layer disposed on the substrate 12; a fixed interdigitated conductive switch plate disposed on the dielectric layer 21; a fixed interdigitated conductive actuator plate disposed on the dielectric layer 22; and a laterally movable conductive shuttle 23 disposed between the fixed interdigitated switch plate 21 and the fixed interdigitated actuator plate 22 that interconnects the laterally movable interdigitated switch plates 24 with the laterally movable interdigitated actuator plates 25.

The only difference between a tunable capacitor and a switch is that, in the switch device 10, the voltage applied to the actuator is high enough to fully close the switch gap 29. In this case, the switch becomes a contact ohmic switch. If capacitive switches are desired, a dielectric layer 45 (Parylene, for example) can be applied on the device 10 to coat it and avoid an ohmic contact when the switch is on, as shown in FIG. 1*e‴*.

High-Q Inductors

Figure 5:
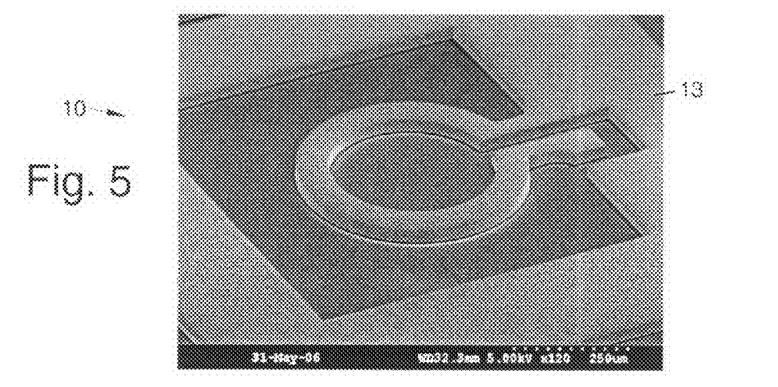
FIG. 5 is a SEM view of a 40 µm thick, 0.6nH silver inductor fabricated using the method illustrated in FIGS. 1a-e.
Figure 6:
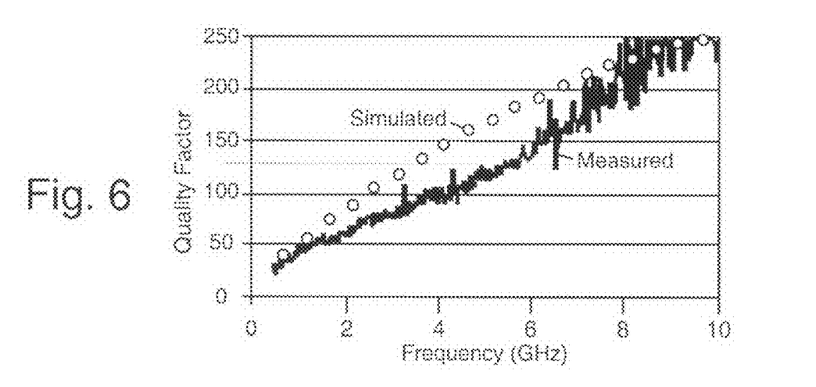
FIG. 6 illustrates measured and simulated Q of the silver inductor.

Due to extreme reduction of both the metal loss and substrate loss, fabricated inductors 10 have exceptionally high Q. FIG. 5 shows a SEM view of a 40 μm thick 0.6nH inductor 10 that exhibits a high Q of >200 at 8 GHz. The S-parameters of this inductor 10 were simulated in Sonnet, using a Sonnet thick metal model. The simulated Q validates the accuracy of the high measured Q as shown in FIG. 6. It is believed that this is the highest measured embedded Q to date for spiral inductors 10 at such a high frequency.

Figure 7:
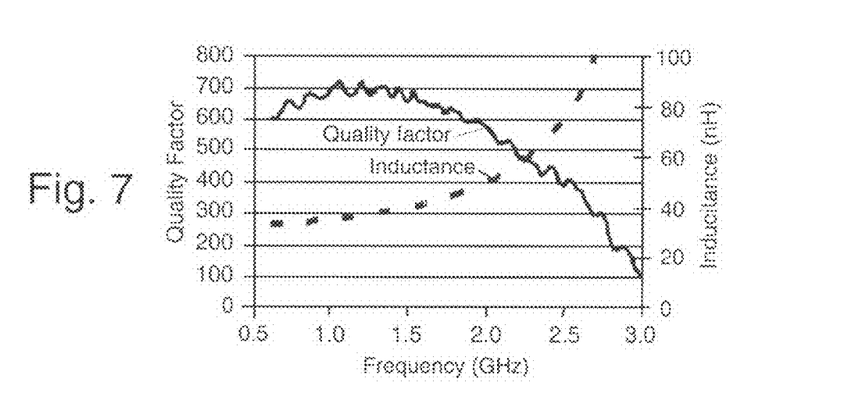
FIG. 7 illustrates measured Q and inductance of a 32nH silver inductor.
Figure 8A:
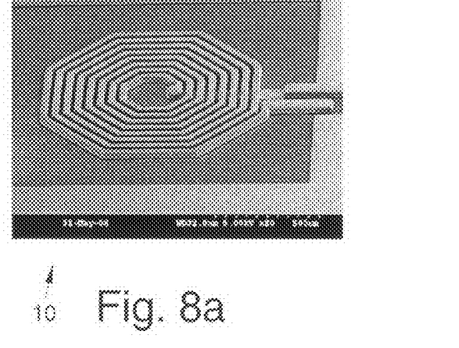
FIG. 8a is a SEM view of a 32nH silver inductor fabricated using the method illustrated in FIGS. 1a-1e.
Figure 8B:
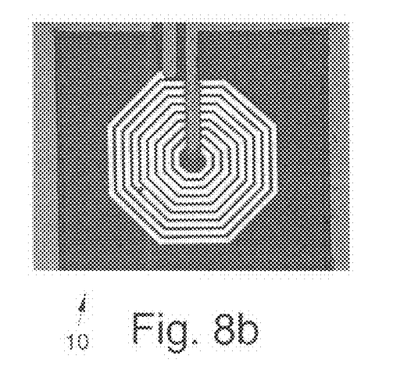
FIG. 8b is a micrograph of the silver inductor taken from backside of the wafer.

To explore the effect of using silver on reduction of the metal loss, an eight-turn 32nH inductor 10 was fabricated. The fabricated inductor 10 exhibits a high Q of 35 at 1.2 GHz, with a SRF of larger than 3 GHz as shown in FIG. 7. FIG. 8*a* shows a SEM view of this inductor 10 along and FIG. 8*b* shows a micrograph of the inductor 10 taken from the backside of the wafer showing the device 10 on an Avatrel diaphragm 12.

Fixed Bandpass Filter

Figure 9:
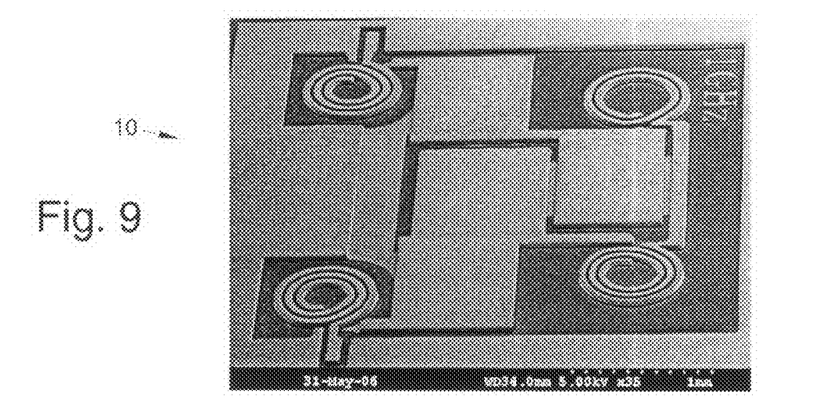
FIG. 9 is a SEM view of the third order elliptic filter fabricated using the method illustrated in FIGS. 1a-1e.
Figure 10:
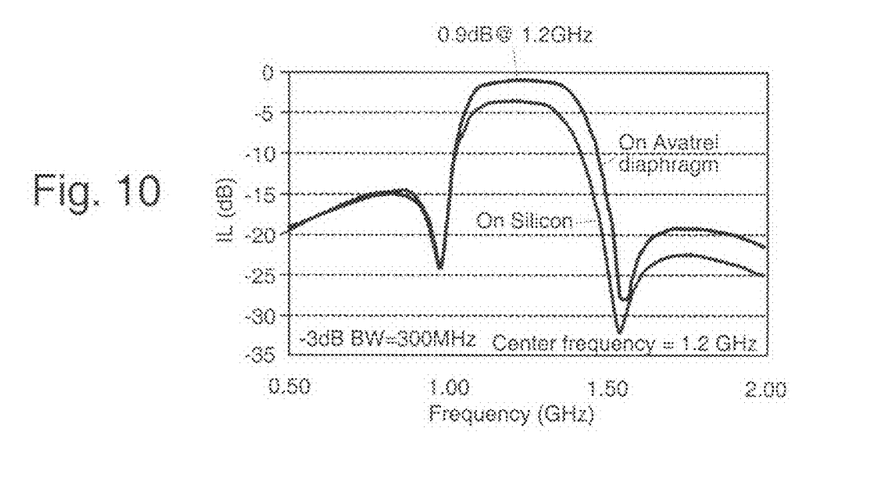
FIG. 10 illustrates measured $S_{21}$ of a third order elliptic filter fabricated on Avatrel diaphragm (shown in FIG. 9) and silicon, showing an insertion loss of 0.9 dB on Avatrel and 3.6 dB on CMOS grade silicon.

A third-order elliptic LC filter 10 was designed and fabricated using the above-discussed method 30. The filter 10 was designed to have 300 MHz bandwidth (BW) at the center frequency of 1 GHz. FIG. 10 shows the measured $S_{21}$ of two identical filters 10, one fabricated on an Avatrel™ diaphragm 12 (silicon 11 was removed from the backside), and the other fabricated on a Avatrel™ 12 passivated CMOS grade silicon substrate 11 (silicon was not removed). The fabricated filter 10 on the Avatrel™ diaphragm 12 exhibits a very low insertion loss of 0.9 dB at 1.2 GHz when terminated to 50Ω, which corresponds to an inductor Q of 60 and a capacitor Q of 100 at 1.2 GHz. The identical filter 10 on passivated silicon has an insertion loss of 3.6 dB. A SEM view of the fabricated filter 10 is shown in FIG. 9. With a capacitive gap of 3.5 μm, the LC filter 10 occupies a die area of 3 mm by 3 mm (FIG. 9).

Figure 11:
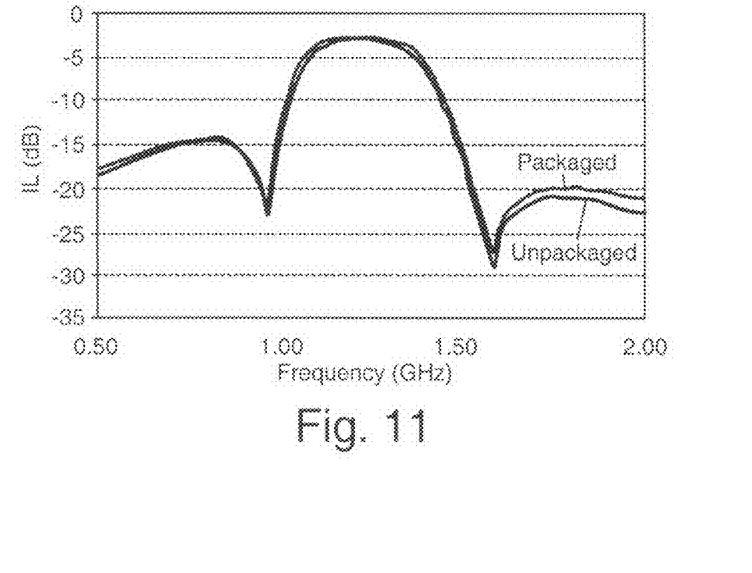
FIG. 11 illustrates measured $S_{21}$ of two identical filters fabricated on the same wafer, one packaged using the fabrication method shown in FIGS. 1a-1h, showing no additional loss for the packaged filter.
Figure 12:
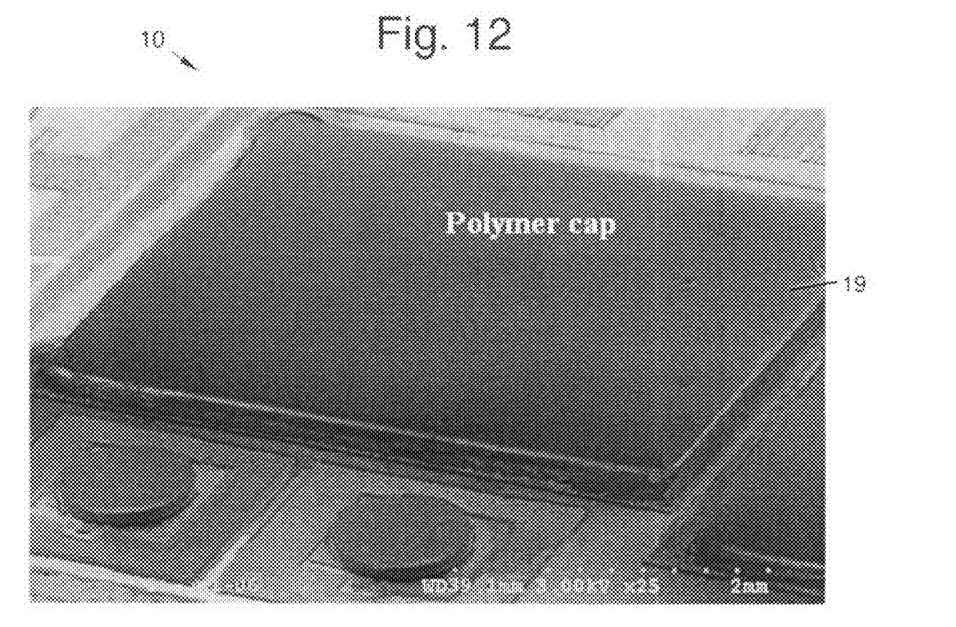
FIG. 12 is a SEM view of the packaged filter.

The fabricated filter 10 on passivated silicon substrate 11 was encapsulated using the fabrication method shown in FIGS. 1*g* and 1*h* to provide a semi-hermetic sealing for the device 10. The measured frequency responses of two identical filters 10, one encapsulated (packaged) and one non-encapsulated (unpackaged) are shown in FIG. 11. The semi-hermetically encapsulated filter 10 does not show any additional insertion loss. A SEM view of the packaged filter 10 is shown in FIG. 12.

Microelectromechanical Voltage-Tunable Bandpass Filter

Figure 13:
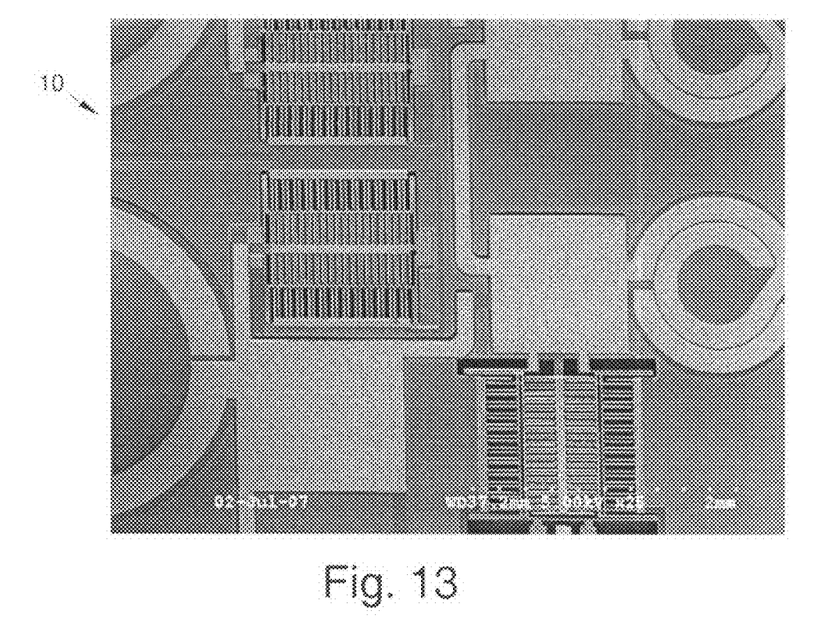
FIG. 13 is a SEM view of a tunable elliptic filter using the method illustrated in FIGS. 1a-e.
Figure 14:
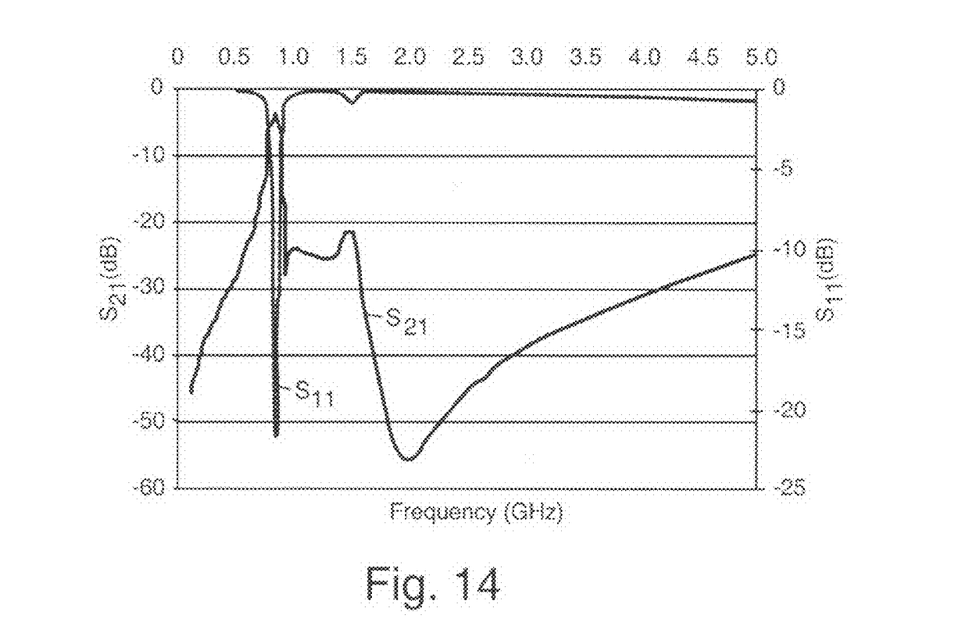
FIG. 14 illustrates measured $S_{21}$ and $S_{11}$ of the filter shown in FIG. 13.

Using the above-discussed method 30, an integrated tunable lumped-element filter 10 at 831 MHz with a 3 dB-bandwidth of 77 MHz (9% bandwidth) and an embedded insertion loss of 4.0 dB is fabricated. Both two-port and one-port tunable capacitors 10 fabricated using the disclosed method 30 are incorporated in the filter 10 to achieve continuous frequency tuning. The fixed plates of the tunable capacitors 10 were connected to the inductors to make tunable lumped inductor-capacitor tank circuits 10. The tunable filter 10 comprises four tunable tank circuits connected together in an elliptic configuration. It is to be understood that the inductors may be planar, solenoid type or transmission lines. In the fabricated filter, spiral type inductors were used. FIG. 13 shows a SEM view of this filter 10. The measured S-parameters of the filter 10 are shown in FIG. 14.

Thus, high-Q micromachined silver tunable and fixed passive and filter devices 10 have been disclosed. High aspect-ratio silver technology was used to improve the metal loss of the passive devices 10 at RF frequency. A 0.4 pF tunable capacitor 10 shows an embedded Q>250 at 1 GHz, and a tuning of 2.3:1. A 1 nH inductor 10 fabricated using the same technique exhibits Q>150 in 8-23 GHz range. A third-order elliptic filter 10 shows an insertion loss of 0.9 dB at 1.2 GHz. Wafer-level polymer packaging of the filter 10 did not cause any additional loss.

It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:

1. A voltage tunable micromechanical capacitor apparatus comprising:
   a substrate;
   a dielectric layer disposed on the substrate;
   a fixed interdigitated conductive capacitor plate disposed on the dielectric layer;
   a fixed interdigitated conductive actuator plate disposed on the dielectric layer; and
   a laterally movable conductive shuttle disposed between the fixed interdigitated capacitor plate and the fixed interdigitated actuator plate that interconnects a laterally movable interdigitated capacitor plate with a laterally movable interdigitated actuator plate.

2. The apparatus recited in claim 1 wherein the shuttle comprises:
   the laterally movable interdigitated conductive capacitor plate disposed between the fixed capacitor plate and the movable shuttle;
   the laterally movable interdigitated conductive actuator plate disposed between the movable capacitor plate and the fixed actuator plate; and
   a movable dielectric layer disposed between the movable capacitor plate and the movable actuator plate, providing mechanical connection between them.

3. The apparatus recited in claim 1 wherein the movable capacitor plate and actuator plate are separated from the dielectric layer by a gap.

4. The apparatus recited in claim 1 wherein the substrate has a backside cavity closely formed under the conductive interdigitated plates to reduce the substrate loss.

5. The apparatus recited in claim 1 wherein the substrate is selected from a group including silicon, CMOS, BiCMOS, gallium arsenide, indium phosphide, glass, ceramic, silicon carbide, sapphire, organic and polymer.

6. The apparatus recited in claim 1 wherein the conductive layer is selected from a group including silver, gold, aluminum, nickel and copper.

7. The apparatus recited in claim 1 wherein the dielectric layer is selected from a group including silicon dioxide, silicon nitride, hafnium dioxide, zirconium oxide and low-loss polymer.

8. The apparatus recited in claim 1 wherein the gap between the fixed and movable plates of the capacitor is smaller than the gap between the fixed and movable plates of the actuator.

9. Apparatus recited in claim 1 further comprising a dielectric layer that coats the conductive layer to further increase the capacitance.

10. Apparatus recited in claim 1 further comprising:
    a first conductive layer disposed on the dielectric layer that forms a routing layer;
    a second dielectric layer disposed on the first conductive layer and patterned to create access points and support points; and
    wherein the conductive layer comprises a spiral inductor that is connected to the fixed interdigitated capacitor plate to create a voltage tunable inductor-capacitor tank circuit.

11. The apparatus recited in claim 10 wherein the routing conductive layer is selected from a group including polysilicon, silver, gold, aluminum, nickel, and copper.

12. The apparatus recited in claim 10 wherein the second dielectric layer is selected from a group including air, silicon dioxide, silicon nitride, hafnium dioxide, zirconium oxide, and polymer.

13. Apparatus recited in claim 1 wherein the conductive layer comprises a transmission line inductor that is connected to the fixed interdigitated capacitor plate to create a voltage tunable inductor-capacitor tank circuit.

14. The apparatus recited in claim 1 further comprising:
    a first conductive layer disposed on the dielectric layer that forms a routing layer;
    a second dielectric layer disposed on the first conductive layer and patterned to create access points and support points; and
    wherein the conductive layer and the routing layer form a fixed capacitor that is connected to the fixed interdigitated capacitor plate to create a larger tunable capacitor.

15. The apparatus recited in claim 14 wherein the routing conductive layer is selected from a group including polysilicon, silver, gold, aluminum, nickel, and copper.

16. The apparatus recited in claim 14 wherein the second dielectric layer is selected from a group including air, silicon dioxide, silicon nitride, hafnium dioxide, zirconium oxide, and polymer.

17. The apparatus recited in claim 1 further comprising:
    an encapsulating layer disposed on the dielectric layer that forms a semi-hermetic cavity surrounding the capacitor plate, the actuator plate and the shuttle.

* * * * *